United States Patent
D'angelo et al.

(10) Patent No.: US 10,468,948 B2
(45) Date of Patent: Nov. 5, 2019

(54) METHOD OF CONTROLLING ELECTRIC MOTORS, CORRESPONDING SYSTEM, ELECTRIC MOTOR AND COMPUTER PROGRAM PRODUCT

(71) Applicant: STMicroelectronics S.R.L., Agrate Brianza (IT)

(72) Inventors: Giuseppe D'angelo, Tufino (IT); Michele Bisogno, Cava de Tirreni (IT); Virginia Clemente, Montesarchio (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 660 days.

(21) Appl. No.: 15/066,802

(22) Filed: Mar. 10, 2016

(65) Prior Publication Data
US 2017/0025929 A1 Jan. 26, 2017

(30) Foreign Application Priority Data
Jul. 21, 2015 (IT) .................. 102015000036379

(51) Int. Cl.
*H02P 27/08* (2006.01)
*H02P 31/00* (2006.01)
(Continued)

(52) U.S. Cl.
CPC .......... *H02K 11/02* (2013.01); *H02M 7/5395* (2013.01); *H02P 27/08* (2013.01); *H02P 31/00* (2013.01); *H03K 4/06* (2013.01)

(58) Field of Classification Search
CPC ........... H02M 5/458; H03K 5/082; H03L 7/18
See application file for complete search history.

(56) References Cited

U.S. PATENT DOCUMENTS

2006/0007987 A1* 1/2006 Yoneda ................. H03L 7/0805
    375/130
2009/0296805 A1* 12/2009 Takahashi .............. G06F 1/025
    375/238
(Continued)

FOREIGN PATENT DOCUMENTS

JP          4361476 B2    11/2009

OTHER PUBLICATIONS

Balcells et al., "EMI Reduction in Switched Power Converters Using Frequency Modulation Techniques," *IEEE Transactions on Electromagnetic Compatibility* 47(3):569-576, 2005.
(Continued)

*Primary Examiner* — Bickey Dhakal
*Assistant Examiner* — Charles S Laughlin
(74) *Attorney, Agent, or Firm* — Seed Intellectual Property Law Group LLP

(57) ABSTRACT

An electric motor is controlled by means of pulse-width modulated control signal having edge transitions occurring at certain transition count values of the pulses of a clock signal which is frequency-modulated with a step-wise frequency modulation (e.g., SSCG or Spread Spectrum Clock Generation). A frequency unmodulated clock signal is provided having a fixed period indicative of the period of the pulse-width modulated control signals. The transition count values are set as a function of a predicted count value and/or a predicted frequency value for the frequency-modulated clock signal. Prediction occurs as a function of the frequency unmodulated clock signal, so that the transition count values are compensated against the step-wise (e.g., SSCG) frequency modulation.

16 Claims, 7 Drawing Sheets

(51) Int. Cl.
*H02K 11/02* (2016.01)
*H02M 7/5395* (2006.01)
*H03K 4/06* (2006.01)

(56) References Cited

U.S. PATENT DOCUMENTS

2010/0090775 A1* 4/2010 Huda ................. H03K 3/84
          332/117
2016/0204774 A1* 7/2016 Liu .................. H03K 21/023
          327/160

OTHER PUBLICATIONS

Santolaria et al., "Evaluation of Switching Frequency Modulation in EMI Emissions Reduction applied to Power Converters," IEEE, 2003, pp. 2306-2311. (6 pages).

* cited by examiner

US 10,468,948 B2

METHOD OF CONTROLLING ELECTRIC MOTORS, CORRESPONDING SYSTEM, ELECTRIC MOTOR AND COMPUTER PROGRAM PRODUCT

BACKGROUND

Technical Field

The description relates generally to controlling electric motors and one or more embodiments relate to electric motor control applications with a triangle wave modulated system clock.

Description of the Related Art

Electromagnetic interference (EMI), once the exclusive concern of equipment designers working with high speed signals, is no longer limited to a narrow class of high-end applications. Continued innovation in semiconductor technology has resulted in the ready availability of cost effective, high performance System-on-Chip (SoC) devices, Micro-Controller Units (MCUs), processors, Digital Signal Processors (DSPs), Application Specific Integrated Circuits (ASICs), Field Programmable Gate Arrays (FPGAs) and Analog/Digital Converters (ADCs).

High speed clocking signals used to control these integrated circuits (ICs) may, however, generate EMI and, as a consequence, present more challenges for designers of consumer, enterprise, communications and embedded equipment.

The need is therefore felt for improved arrangements adapted for use in such a challenging environment.

BRIEF SUMMARY

One or more embodiments relate to a corresponding system and corresponding apparatus (e.g., an electric motor equipped with a control system) as well as to a computer program product loadable in to the memory of at least one processing device (e.g., a PWM processor module for controlling an electric motor) and including software code portions for executing the steps of the method when the product is run on at least one computer. As used herein, reference to such a computer program product is understood as being equivalent to reference to a computer-readable means containing instructions for controlling the processing system in order to co-ordinate implementation of methods according to the embodiments of the present disclosure. Reference to "at least one processor device" is intended to highlight the possibility for the present disclosure to be implemented in modular and/or distributed form.

The claims are an integral part of the disclosure of one or more exemplary embodiments as provided herein.

One or more embodiments may facilitate correcting the error introduced by a modulated clock for motor control applications when using a modulated clock for an overall system.

One or more embodiments may permit avoiding, or at least reducing, the use of other conventional EMI-lowering techniques such as e.g., filtering, shielding, and good layout practice, with advantages realized in terms of cost and time.

BRIEF DESCRIPTION OF THE SEVERAL VIEWS OF THE FIGURES

One or more embodiments will now be described, by way of example only, with reference to the annexed figures, in which.

DETAILED DESCRIPTION

Figure 1:
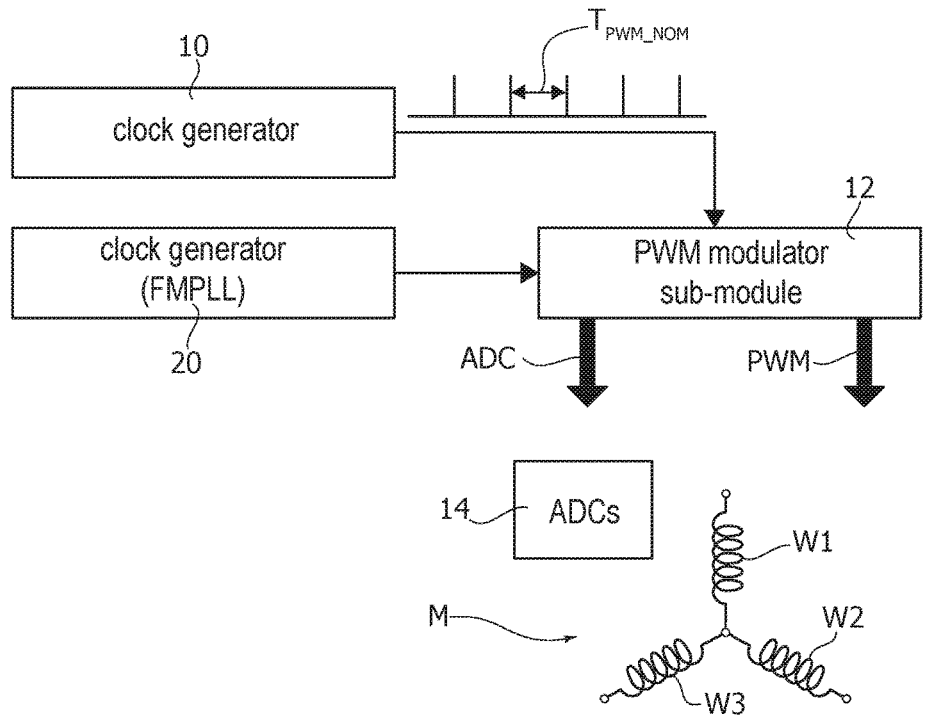
FIG. 1 is a schematic representation of a control system for an electric motor.

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In various applications, an effective and efficient approach to controlling and reducing ElectroMagnetic Interference (EMI) may involve Spread Spectrum Clock Generation (SSCG) technology. Instead of maintaining a constant frequency, spread spectrum techniques modulate a system clock across a (much) smaller frequency range that creates a frequency spectrum with sideband harmonics. By intentionally spreading the narrowband repetitive clock across a broader band, the peak spectral energy of both the fundamental and harmonic frequencies can be reduced simultaneously. Effectively, an SSCG clock IC adds controlled jitter by increasing and decreasing the clock frequency, e.g., linearly. While the total radiated energy in the signal is the same as in the case of an unmodulated signal, the spectral components occur at a lower magnitude due to spreading across more frequencies/greater bandwidth. End developers thus are able to reduce EMI to desired levels.

Spread spectrum clock generation may result in an effective reduction of EMI throughout the system compared to other EMI reduction methods. Specifically, since the clock and timing signals derived from an SSCG clock are modulated by the same percentage (including, e.g., buses and interconnects), EMI reduction from SSCG technology benefits the entire system, not just a local circuit.

For various applications, implementing a spread spectrum clock into a system, e.g., during the early design stages can mitigate appreciably the need for further EMI reduction measures. For instance, a triangular modulation wave may be used with programmable modulation frequency ($f_{mod}$) and modulation depth percentage (MD).

The error introduced by the modulated clock may not be acceptable for certain applications, and an additional non-modulated clock might be used in those parts of the system where a stable non-modulated clock is required.

This may apply, e.g., to electric motor control applications, e.g., PWM (Pulse Width Modulation) control of an electric motor M where (in a manner known per se, which makes it unnecessary to provide a more detailed description herein) PWM signals are generated for feeding to the motor windings (see, e.g., W1, W2, W3 in FIG. 1) along with trigger signals sent to analog-to-digital converters (ADCs) 14 for sampling the motor phase currents and/or other signals used for the control.

As a result, the EMI reduction effect may not extend to the whole system and other traditional EMI-lowering techniques such as filtering, shielding, and good layout practice are implemented, which add to the cost and the time involved in the design of the system.

One or more embodiments as exemplified in FIG. 1 may include a first clock generator 10 adapted to generate a non-modulated (unmodulated) clock signal, that is a non-modulated clock signal including a train of pulses with a fixed period. In one or more embodiments, this may be a low-frequency, e.g., 20 KHz, signal with a period selected to be equal to a nominal value $T_{PWM\_NOM}$ of the PWM period, e.g., 50 microseconds.

In one or more embodiments, the duration of the pulses may be reduced to a (minimum) value sufficient to permit detection by a PWM modulator sub-module 12 in order to generate (in a manner known per se, which is not a subject-matter of the described embodiments) PWM-modulated control signals for an electric motor M.

These control signals may include, e.g.:
PWM drive signals for feeding to the motor windings W1, W2, W3,
trigger signals ADC for the analog-to-digital converters 14 for sampling the motor phase currents and/or any other signals used for the controlling the motor M. For instance, in one or more embodiments, the signals ADC may mark the conversion start times for the analog-to-digital converters.

The designation "control signal" will be used herein for the sake of simplicity to designate collectively signals such as the PWM drive signals and the ADC trigger signals in FIG. 1.

In one or more embodiments, the clock signal (pulse train) from the generator 10 may be used for determining a desired constant—period—of the PWM signal in the module 12. For instance, in one or more embodiments, the clock signal from the generator 10 may positively reset (or "capture") a PWM counter in the module 12.

One or more embodiments may be resort to such an approach in view of the fact that generation of the control signals via such a counter in the module 12 may take place as a function of the clock pulses provided by a frequency-modulated by, e.g., a triangle wave (modulating) signal of a second generator 20.

Figure 2:
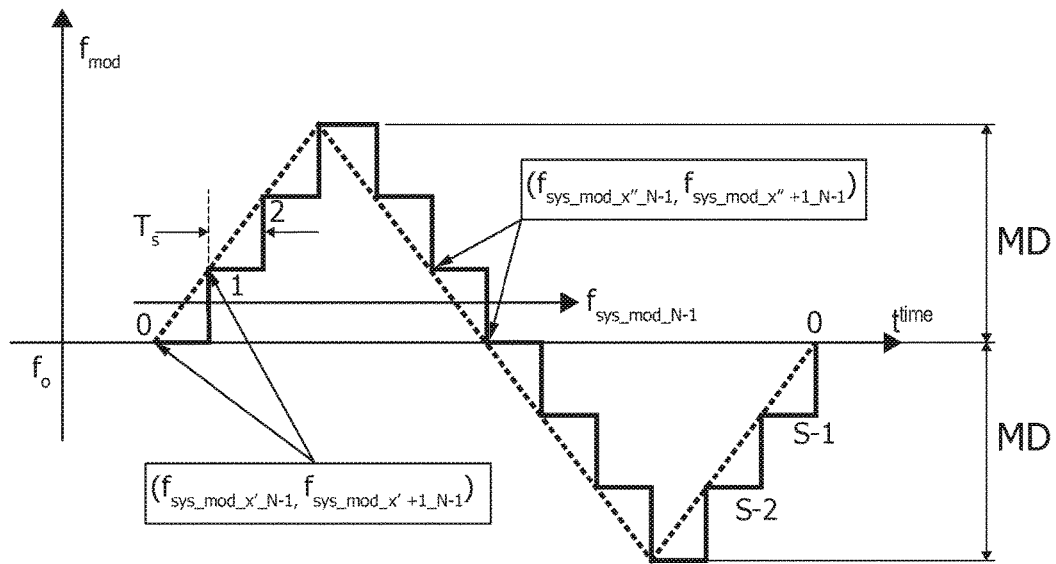
FIG. 2 exemplifies a modulation signal for use in one or more embodiments.

FIG. 2 is an exemplary representation of such a center spread (step-wise) triangle wave modulation with programmable modulation frequency $f_{mod}$ around a base frequency $f_o$ and modulation depth percentage MD, where the number of modulation steps is fixed.

The second generator 20 (e.g., a frequency-modulated phase locked loop (FMPLL)) is exemplary of a system clock signal generated in compliance with Spread Spectrum Clock Generation (SSCG) technology in order to counter EMI effects as discussed in the introductory portion of this description. It will be appreciated that, while the diagram of FIG. 2 depicts per se the amplitude of the modulation signal over time (abscissa scale), the ordinate values are plotted against a resulting modulation frequency.

By referring, again purely by way of example, to the exemplary numerical values indicated in the foregoing (e.g., an unmodulated 20 KHz clock from the generator 10), the triangular-wave modulation signal from the circuit 20 (e.g., a FMPLL) may correspond to a SSCG modulation in a frequency range between 142.68 MHz and 150 MHz, with a quantized modulation amplitude of, e.g., 4.88%. The modulation change may take place in S steps 0, 1, 2, . . . , S-2, S-1 with, e.g., S=12, with a percentage change for each step of, e.g., 0.813%.

Frequency changes may occur, e.g., at instants separated by a time $T_S$. For the sake of simplicity $T_S$—that is the time between two modulation steps—will be assumed to be constant.

Also, operation of one or more embodiments will be first exemplified under the assumption that $T_S \geq T_{PWM\_NOM}$, where $T_{PWM\_NOM}$ is the nominal value of period of the PWM control signals, so that only one modulation step may be assumed to occur during one PWM period.

Consistently, the left-hand side of FIG. 2 exemplifies an (upward) modulation step taking place during a PWM period N-1 from a frequency $f_{sys\_mod\_x'\_N-1}$ to a frequency $f_{sys\_mod\_x'+1\_N-1}$ resulting in an average value $f_{sys\_mod\_N-1}$ for the frequency of the clock generator 20 over the period N-1.

An identical average value may result from, e.g., a (downward) modulation step from a frequency $f_{sys\_mod\_x''\_N-1}$ and a frequency $f_{sys\_mod\_x''+1\_N-1}$.

Whatever the numerical values selected and the specific criteria adopted for producing the PWM control signals (e.g., for modulating their pulse width) generation by conventional means as a function of a frequency-modulated clock signal as generated by the generator 20 and including rising and falling frequency modulation steps 0, 1, 2, . . . , S-2, S-1 might induce errors with respect to the "nominal" unmodulated PWM period and the duty cycle start time values to be fed to the motor windings W1, W2, W3 and the converters 14, which may adversely affect operation of the motor M.

Figure 3:
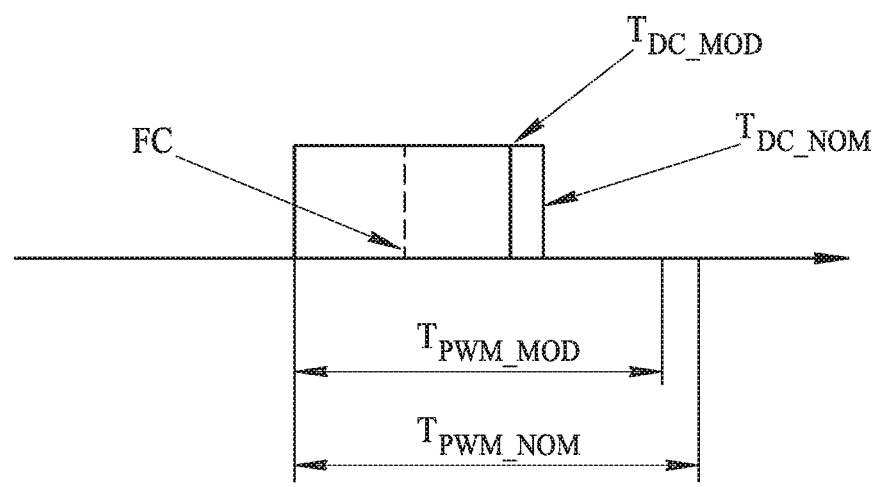
FIG. 3 is exemplary of possible effects of a modulated system clock on PWM control signals.

This situation is exemplified in the diagram of FIG. 3. There the "nominal" expected values of the period and the "on" period (which dictates the duty cycle) of the PWM control signals are denoted by $T_{PWM\_NOM}$ and $T_{DC\_NOM}$, respectively.

A frequency change in the clock signal from the generator 20 might result in a change of both these PWM control signals to actual "modulated" values $T_{PWM\_MOD}$ and $T_{DC\_MOD}$.

This may be understood by noting that an internal counter within the PWM module 12, when clocked with the modulated signal from the generator 20, may reach any count values set to switch the PWM signal (e.g., from "0" to "1" or from "1" to "0") either "earlier" or "later", depending on whether the frequency of the modulated signal from the generator 20 is subjected to an upward or downward modulation step as exemplified in FIG. 2.

FIG. 3 exemplifies a case where, following a change of frequency FC, $T_{PWM\_MOD} < T_{PWM\_NOM}$ and $T_{DC\_MOD} < T_{DC\_NOM}$. More generally, a frequency modulation step in the modulated signal from the generator 20 may result in $T_{DC\_NOM}/T_{PWM\_NOM} \neq T_{DC\_MOD}/T_{PWM\_MOD}$.

This may adversely affect operation of the motor M both because the motor windings W1, W2, W3 may be supplied with PWM drive signals having a time behavior different from the nominal expected behavior, and because the analog-to-digital converters 14 for sampling the motor phase currents and/or any other signals used for the controlling the motor may be triggered at "incorrect" times.

Just by way of reference, a PWM control signal with a period having a nominal duration $T_{PWM\_NOM}$ of 50 microseconds (20 kHz) corresponding to 7500 cycles of an unmodulated 150 MHz system clock would have its duration varied in the range between 50 and 52.57 microseconds with a system clock subjected to modulation in a frequency range between 142.68 MHz and 150 MHz.

Figure 4:
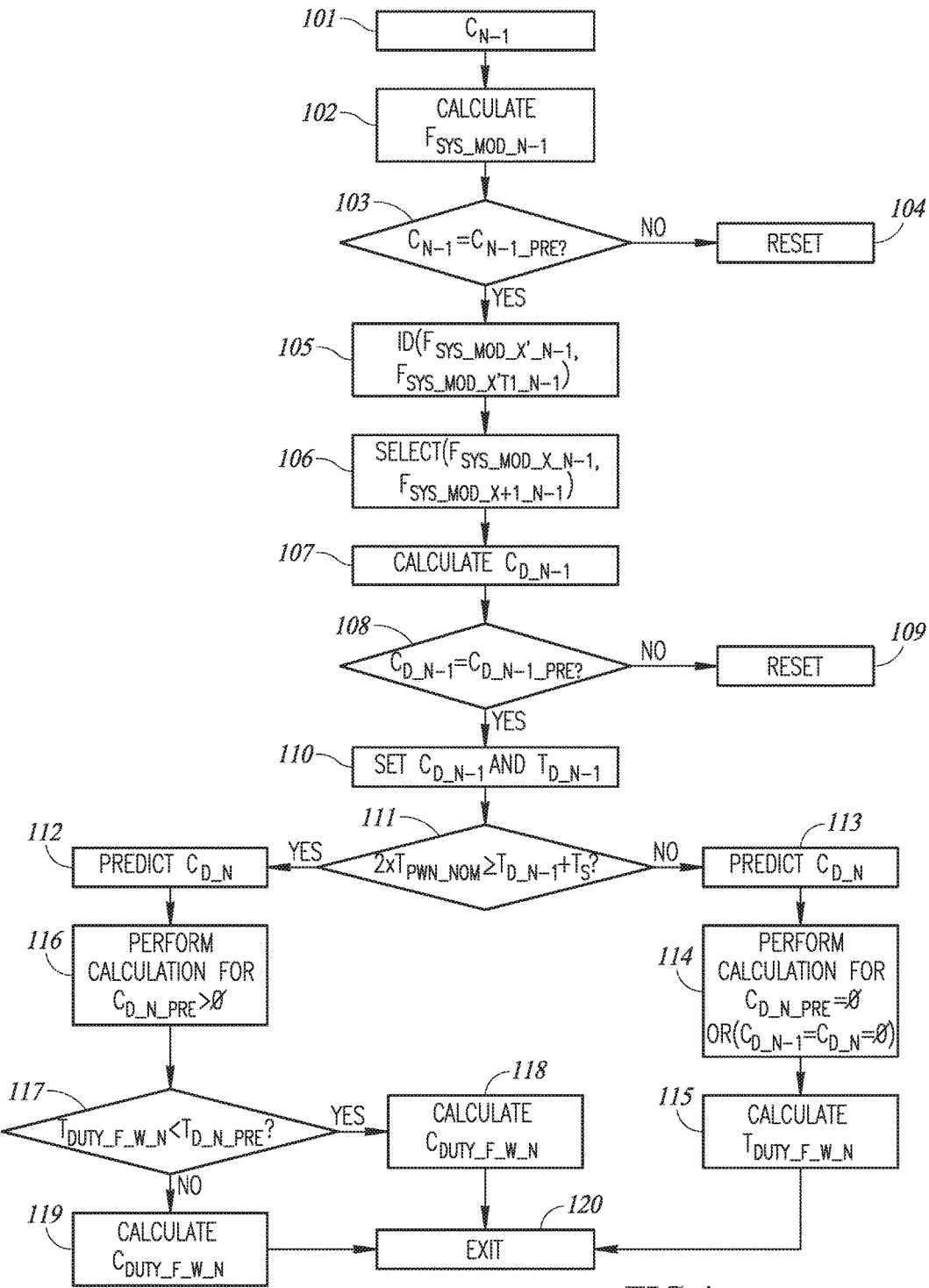
FIG. 4 is an exemplary flow-chart of operation of one or more embodiments.

FIG. 4 is an exemplary flow chart of a procedure which may be implemented in the PWM module 12 based on the (modulated), e.g., SSCG clock signal from the generator 20 and the unmodulated signal from the generator 10 which may be used as "reference" with an unmodulated pulse repetition frequency of, e.g., 20 KHz.

For the sake of simplicity, an exemplary procedure will first be described under the assumption—already considered in the foregoing—of a single frequency modulation step during a PWM period, that is $T_S \geq T_{PWM\_NOM}$ where $T_{PWM\_NOM}$ is the nominal value of the PWM period. In one or more embodiments, this may be maintained by using the clock signal from the generator 10 as a reference so that (by referring to the representation of FIG. 3) $T_{PWM\_NOM}$ and $T_{PWM\_MOD}$ may coincide.

It will be otherwise be noted that $C_{PWM\_NOM} \neq C_{PWM\_MOD}$, namely the count values C of an internal counter to the module 12 which may dictate switching of the PWM signal (and thus the times $T_{DC\_NOM}$ and $T_{DC\_MOD}$ of FIG. 3, that is the duty cycle DC of the PWM signal) will generally differ from each other, with $C_{PWM\_NOM}$ equal to $T_{PWM\_NOM}*f_0$, where $f_0$ is the basic unmodulated frequency of the generator 20 (see FIG. 2) while $C_{PWM\_MOD}$ equals $T_{PWM\_NOM}*f_{MOD}$, where $f_{MOD}$ is the actual current value of the modulated frequency of the generator 20 (see again FIG. 2).

In this exemplary description, T is used to indicate values expressed as times (e.g., $T_{PWM\_NOM}=T_{PWM\_MOD}$, $T_S$ being the time between two modulation steps, and so on), while C denotes in general expressed as clock pulses (clock cycles) or counts (e.g., $C_{PWM\_NOM} \neq C_{PWM\_MOD}$). As a result, the period of the PWM signal will be constant (with unmodulated duration) if expressed as a time value, e.g., $T_{PWM\_NOM}$, and variable if expressed as a clock pulse/cycle count ($C_{PWM\_NOM}$ or $C_{PWM\_MOD}$). For that reason, the designation $T_{PWM}$ is used for brevity throughout FIGS. 5 to 8 in order to designate the PWM period which is controlled to correspond to the nominal value $T_{PWM\_NOM}$.

In a step 101, a number $C_{N-1}$ of the (modulated) clock pulses/cycles from the generator 20 during a PWM period N-1 will be read and in a step 102 a value $f_{sys\_mod\_N-1}$ for the average frequency of the clock generator 20 over the period N-1 will be calculated as:

$$f_{sys\_mod\_N-1} = C_{N-1}/T_{PWM\_NOM}$$

wherein the value $T_{PWM\_NOM}$ is derived from the unmodulated clock signal from the generator 10, used as a reference.

In a step 103 the value read for $C_{N-1}$ is compared with a corresponding value $C_{N-1\_PRE}$ previously predicted as better detailed in the following.

If $C_{N-1}$ is found to be different from $C_{N-1\_PRE}$ (possibly by taking into account a possible threshold $|C_{N-1}-C_{N-1\_PRE}|<C_{THR}$, where $C_{THR}$ is a threshold with value—e.g., 1 or 2 pulses—which is dictated by the specific implementation considered and may possibly be zero) then the system exits to a reaction step 104 which is application dependent, e.g., a safe reset state.

Else, in a step 105, the value calculated for $f_{sys\_mod\_N-1}$ may be compared with $f_{sys\_mod\_y\_N-1}$ (with y=0, 1, ..., S-1), that is with the possible (modulated) values for the frequency of the clock generator 20 in order to identify, by considering the modulation profile, a pair of values out of $f_{sys\_mod\_x'\_N-1}$, $f_{sys\_mod\_x'+1\_N-1}$ and $f_{sys\_mod\_x''\_N-1}$, $f_{sys\_mod\_x''+1\_N-1}$ which may lead to an average value $f_{sys\_mod\_N-1}$ depending on whether the condition $f_{sys\_mod\_x'\_N-1} \leq f_{sys\_mod\_N-1} \leq f_{sys\_mod\_x'\_N-1}$ (upward modulation: see FIG. 2) or the condition $f_{sys\_mod\_x''\_N-1} \geq f_{sys\_mod\_N-1} \geq f_{sys\_mod\_x''\_N-1}$ (downward modulation: see again FIG. 2) applies.

In one or more embodiments the step-wise frequency modulation having a triangular modulation profile including upward and downward modulation steps (see FIG. 2) may then be exploited for identifying a pair of values for the frequency of the frequency-modulated clock signal 20 out of plural (e.g., two) pairs as a function of the modulation profile (e.g., upward step or downward step) of the step-wise frequency modulation of the clock generator 20.

In a step 106 a pair $f_{sys\_mod\_x\_N-1}$, $f_{sys\_mod\_x+1\_N-1}$ is selected:

if $(f_{sys\_mod\_x'\_N-1}=f_{sys\_mod\_x+1\_N-2}$ then $(f_{sys\_mod\_x\_N-1}, f_{sys\_mod\_x+1\_N-1})=(f_{sys\_mod\_x'\_N-1}, f_{sys\_mod\_x'+1\_N-1})$ else $(f_{sys\_mod\_x\_N-1}, f_{sys\_mod\_x+1\_N-1})=(f_{sys\_mod\_x''\_N-1}, f_{sys\_mod\_x''+1\_N-1})$.

In a step 107 a value $C_{D\_N-1}=C_{N-1}*(f_{sys\_mod\_N-1}-f_{sys\_mod\_x+1\_N-1})/(f_{sys\_mod\_x\_N-1}-f_{sys\_mod\_x+1\_N-1})$ and $T_{D\_N-1}=C_{D\_N-1}/f_{sys\_mod\_x\_N-1}$ is calculated.

The possible presence of the term $f_{sys\_mod\_x+1\_N-2}$ indicates that the first term in the current period term may coincide with the second term in the pair for the previous period: such a condition may thus be exploited for identifying the pair for the current period once the pair for the previous period is known. A current pair of values for the frequency of the frequency-modulated clock signal of generator 20 may thus be identified as a function of a homologous previous pair of values for the frequency of the frequency-modulated clock signal of generator (20).

As schematically represented in FIG. 5a), values such as $C_{D\_N-1}$ and $C_{D\_N}$ are indicative of the count values reached by the internal counter of the PWM module 12 when two subsequent frequency modulation steps, separated by a time interval $T_S$, occur in two subsequent PWM cycles with a nominal period $T_{PWM\_NOM}$.

In a step 108 the value calculated for $C_{D\_N-1}$ is compared with a corresponding value $C_{D\_N-1\_PRE}$ previously predicted as better detailed in the following.

If $C_{D\_N-1}$ is found to be different from $C_{D\_N-1\_PRE}$ (possibly by taking into account a possible threshold $|C_{D\_N-1}-C_{D\_N-1\_PRE}|<C_{THR'}$, where $C_{THR'}$ is threshold whose value may be dictated by the specific implementation considered and may possibly be zero) then the system exits to a reaction step 109 which is application dependent, e.g., a safe reset state.

Else, in a step 110:

if $C_{D\_N-1}=0$ then $C_{D\_N-1}=C_{D\_N-1\_RES}=(C_{N-2}-C_{D\_N-2})$ and $T_{D\_N-1}=T_{D\_N-1\_RES}=-(T_{PWM\_NOM}-T_{D\_N-2})$.

The case $C_{D\_N-1}=0$ corresponds to no frequency changes occurring during the current period N-1 (see FIG. 5c), so that during the subsequent period N a residue in time (and clock cycles) for the period N−2 may be taken into account by subtracting them from the time $T_S$.

One or more embodiments may thus involve:

detecting if a frequency modulation step in the step-wise frequency modulation of the clock signal of generator 20 has occurred over a certain time $T_S$, and if no such frequency modulation step has occurred (that is, $C_{D\_N-1} = 0$) a time or count residue may be applied to at a subsequent detection time $T_S$, preferably by subtracting that residue from said subsequent detection time.

Such a residue is indicated in the following by the suffix $_{RES}$. By modifying correspondingly $C_{D\_N-1}$ and $T_{D\_N-1}$, the formula of the step 112 will apply also to the case where $C_{D\_N-1}$ is zero. Referring to these residues makes it simpler to indicate in the figures the meaning of $(C_{N-2} - C_{D\_N-2})$ and $(T_{PWM\_NOM} - T_{D\_N-2})$.

In a step 111 a check may be made in order to ascertain which of two conditions apply, namely:

if $2 \cdot T_{PWM\_NOM} \geq T_{D\_N-1} + T_S$, then the system evolves to a step 112;

if $T_{D\_N-1} + T_S \geq 2 \cdot T_{PWM\_NOM}$ then the system evolves to a step 113.

Figure 5:
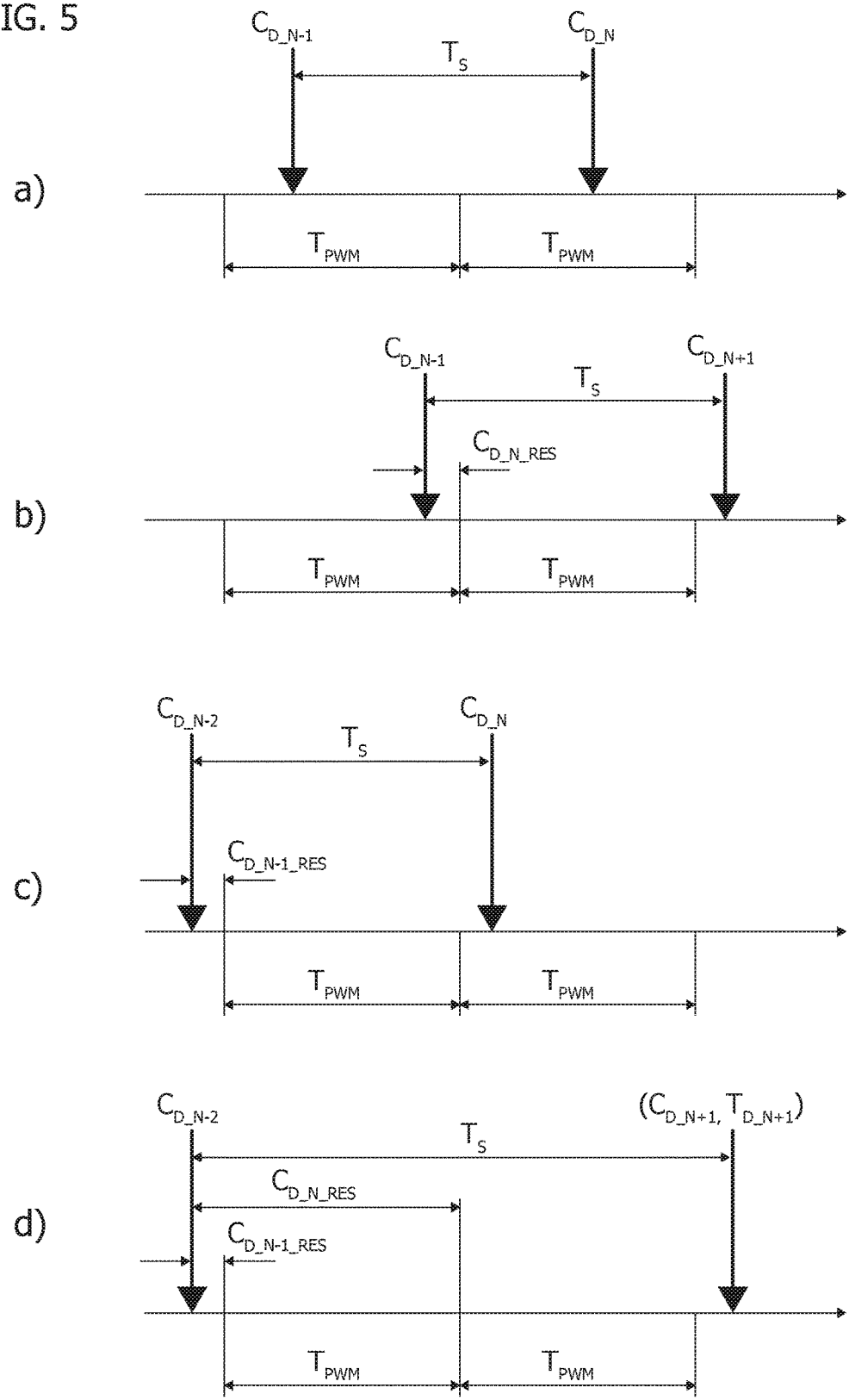
FIGS. 5 to 8 are timing diagrams in support of the description of the exemplary flow chart of FIG. 4.

Various conditions possibly underlying the steps 110 to 114 are portrayed in FIG. 5.

FIG. 5a) portrays the case where $2 \cdot T_{PWM\_NOM} \geq T_{D\_N-1} + T_S$ with $T_{D\_N-1} > 0$, where $T_{D\_N-1}$ corresponds to $C_{D\_N-1}$ expressed as a time.

FIG. 5b) portrays the case where $T_{D\_N-1} + T_S \geq 2 \cdot T_{PWM\_NOM}$, again with $T_{D\_N-1} > 0$.

FIGS. 5c) and 5d) portray the cases where:

$C_{D\_N-1} = 0$ and $C_{D\_N-1\_RES} > 0$;

$C_{D\_N-1} = 0$ and $C_{D\_N-1} = 0$.

In the step 112, a prediction of $C_{D\_N}$ is made based on $T_{D\_N\_PRE} = T_S + T_{D\_N-1} - T_{PWM\_NOM}$ and with $C_{D\_N\_PRE\_RES} = T_{D\_N\_PRE\_RES} = 0$ (see FIG. 5a)

Again $T_{D\_N\_PRE}$ corresponds to $C_{D\_N\_PRE}$, expressed as time, while $C_{D\_N\_PRE\_RES}$, $T_{D\_N\_PRE\_RES}$ are the residues in terms of clock cycles and time, which in this case are zero (FIG. 5a).

In the case $C_{D\_N-1} = 0$, the system is updated according to the condition $C_{D\_N-1} = -C_{D\_N-1\_RES}$ so that $T_{D\_N\_PRE} = T_S - T_{D\_N-1\_RES} - T_{PWM}$ (see FIG. 5c, which corresponds to the condition where $C_{D\_N-1} = 0$ and $C_{D\_N-1\_RES} > 0$) is correctly predicted.

Alternatively, in the step 113, a prediction of $C_{D\_N}$ is made based on $C_{D\_N\_PRE} = 0$ and $T_{D\_N\_PRE\_RES} = T_{PWM\_NOM} - T_{D\_N-1}$ (see FIG. 5b), where $C_{D\_N\_PRE\_RES}$ is the residue (in terms of clock cycles), which differs from zero (only) if $C_{D\_N\_PRE}$ is equal to a zero.

In the step 114, if $C_{D\_N\_PRE} = 0$, then $f_{sys\_mod\_N\_PRE} = f_{sys\_mod\_x\_N\_PRE} = f_{sys\_mod\_x+1\_N\_PRE} = f_{sys\_mod\_x-1\_N-1}$, that is no modulation step change has occurred during the period N; $C_{N\_PRE} = T_{PWM\_NOM} \cdot f_{sys\_mod\_x\_N\_PRE}$ and $C_{D\_N\_PRE\_RES} = C_{N\_PRE} - C_{D\_N-1}$ In case of $C_{D\_N-1} = 0$ and $C_{D\_N} = 0$, $C_{D\_N-1} = C_{D\_N-1\_RES}$ so $T_{D\_N\_PRE\_RES} = T_{PWM\_NOM} + T_{D\_N-1\_RES}$ and in the next period the value can be correctly predicted as $T_{D\_N+1\_PRE} = T_S + T_{D\_N} - T_{PWM\_NOM} = T_S - T_{D\_N\_PRE\_RES} - T_{PWM\_NOM} = T_S - (T_{PWM\_NOM} + T_{D\_N-1\_RES}) - T_{PWM\_NOM} = T_S - T_{D\_N-1\_RES} - 2 \cdot T_{PWM\_NOM}$ (see FIG. 5d)

Again, the suffix $_{PRE}$ indicates predicted values and the suffix $_{RES}$ indicates residues, as defined previously, with C and T indicating entities expressed as clock cycles and times, respectively.

In a step 115 ($C_{D\_N\_PRE} = 0$)—with a concept which may be easily generalized in case of center-aligned PWM—values $C_{DUTY\_F\_W\_N}$ (corresponding to $T_{DUTY\_F\_W\_N}$) equal to $DC_{W\_N} \cdot C_{N\_PRE}$ and $C_{ADC\_CONV\_K\_N} = T_{ADC\_CONV\_K\_N} \cdot f_{sys\_mod\_N\_PRE}$ may be calculated where DC is the duty cycle in percentage to be set, W is the index of the PWM signals and K is the index of the ADC conversions.

Here, the suffix F is used to designate the falling edge in the PWM duty cycle: for instance $C_{DUTY\_F\_W\_N}$ is the point, expressed as clock pulses/cycles at which a certain PWM control signal will go "low" (that is have a falling edge F) during a period N, while DC denotes the duty cycle as a percentage.

The designations "index of the PWM signals W" e "index of the ADC signals K" will generally refer to the windings W1, W2, W3 of the motor M and the associated ADC conversions.

In one or more embodiments, these may amount to two signals for each of the three windings so that W will generally take integer values from 0 to 5.

$T_{ADC}$ denotes the instant in time at which a certain ADC conversion may be started. The same remarks made for the index W apply to the index K, save that the acquisition number may depend on the specific application considered.

Figure 6:
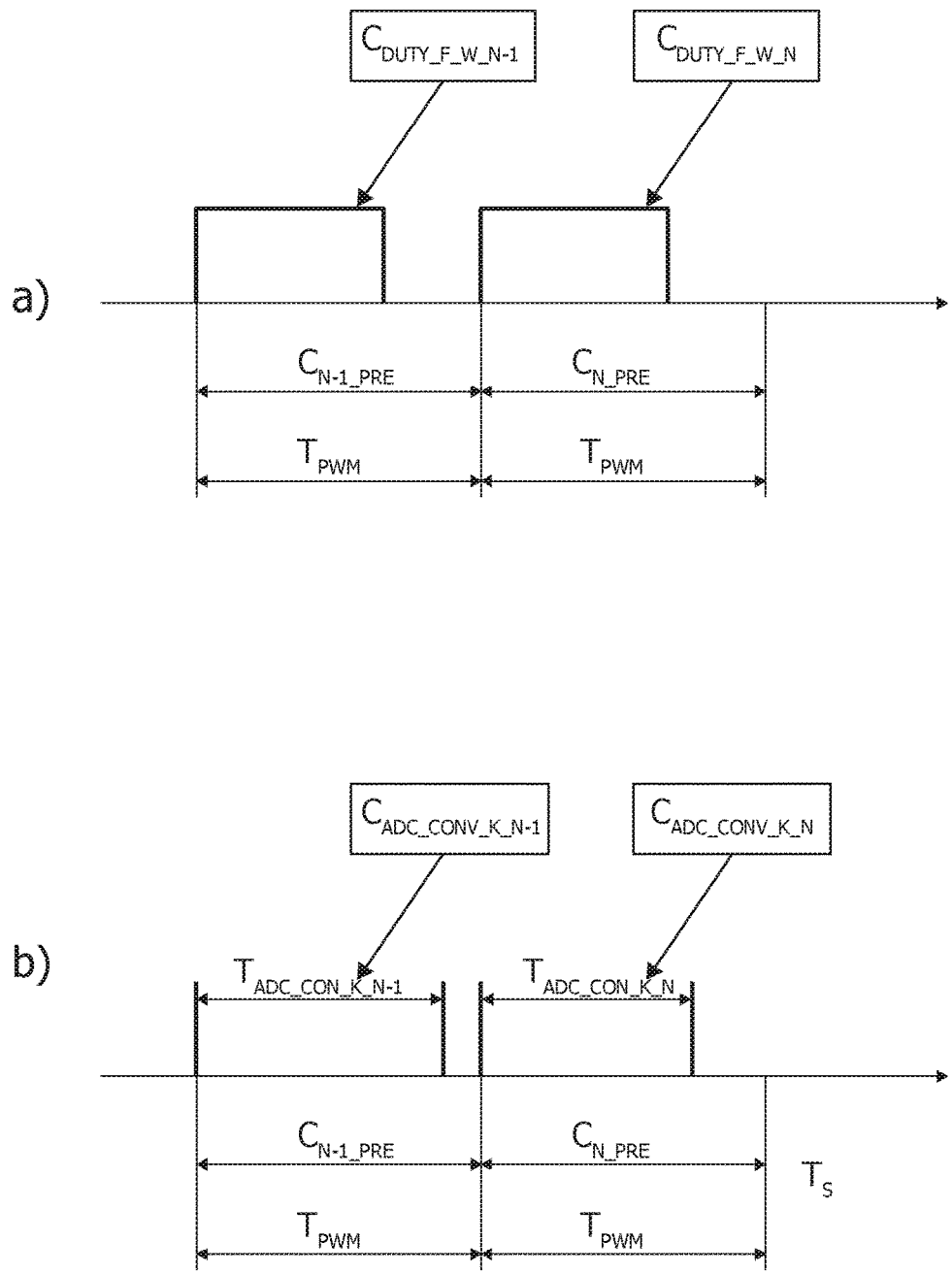
Figure 7:
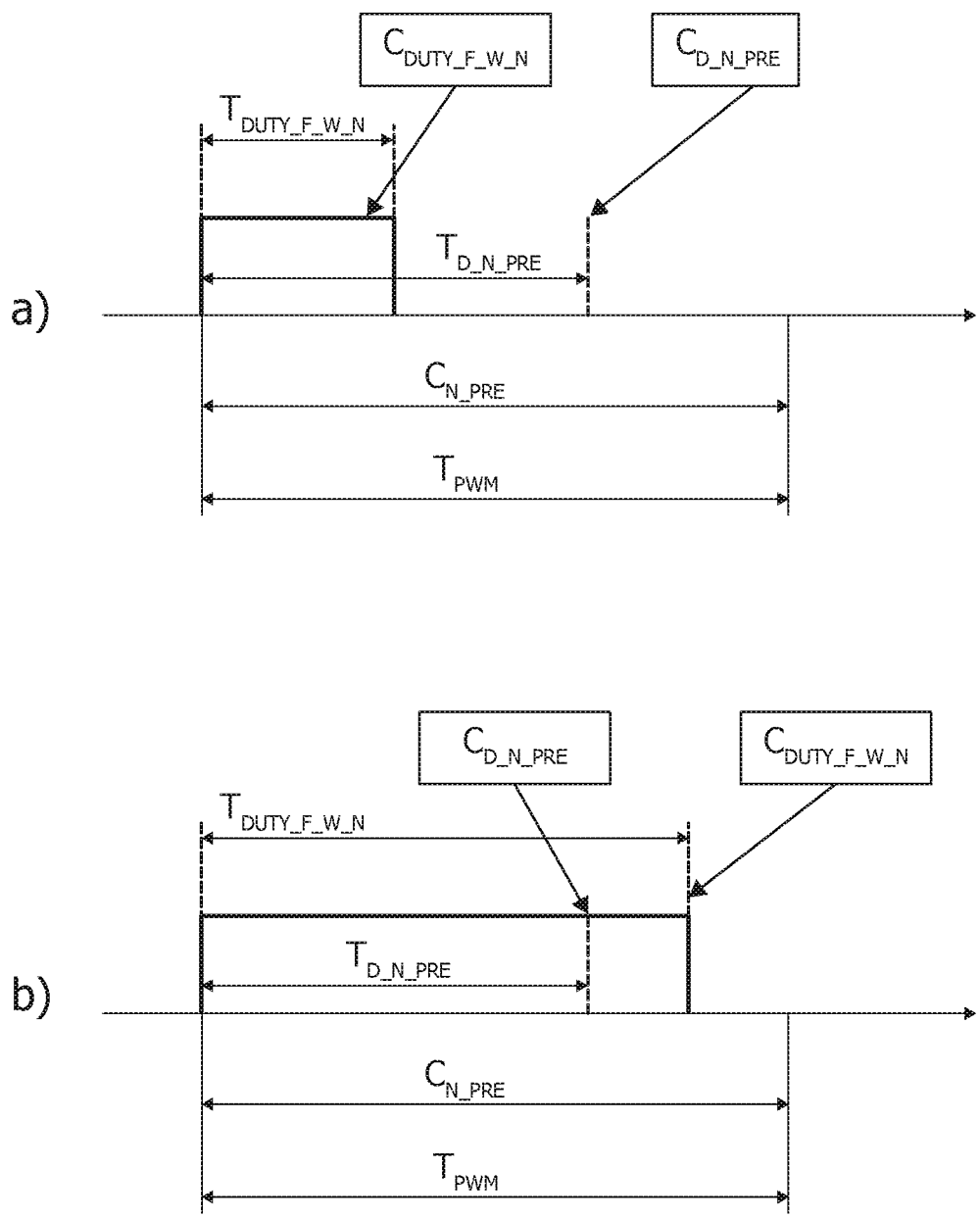
Figure 8:
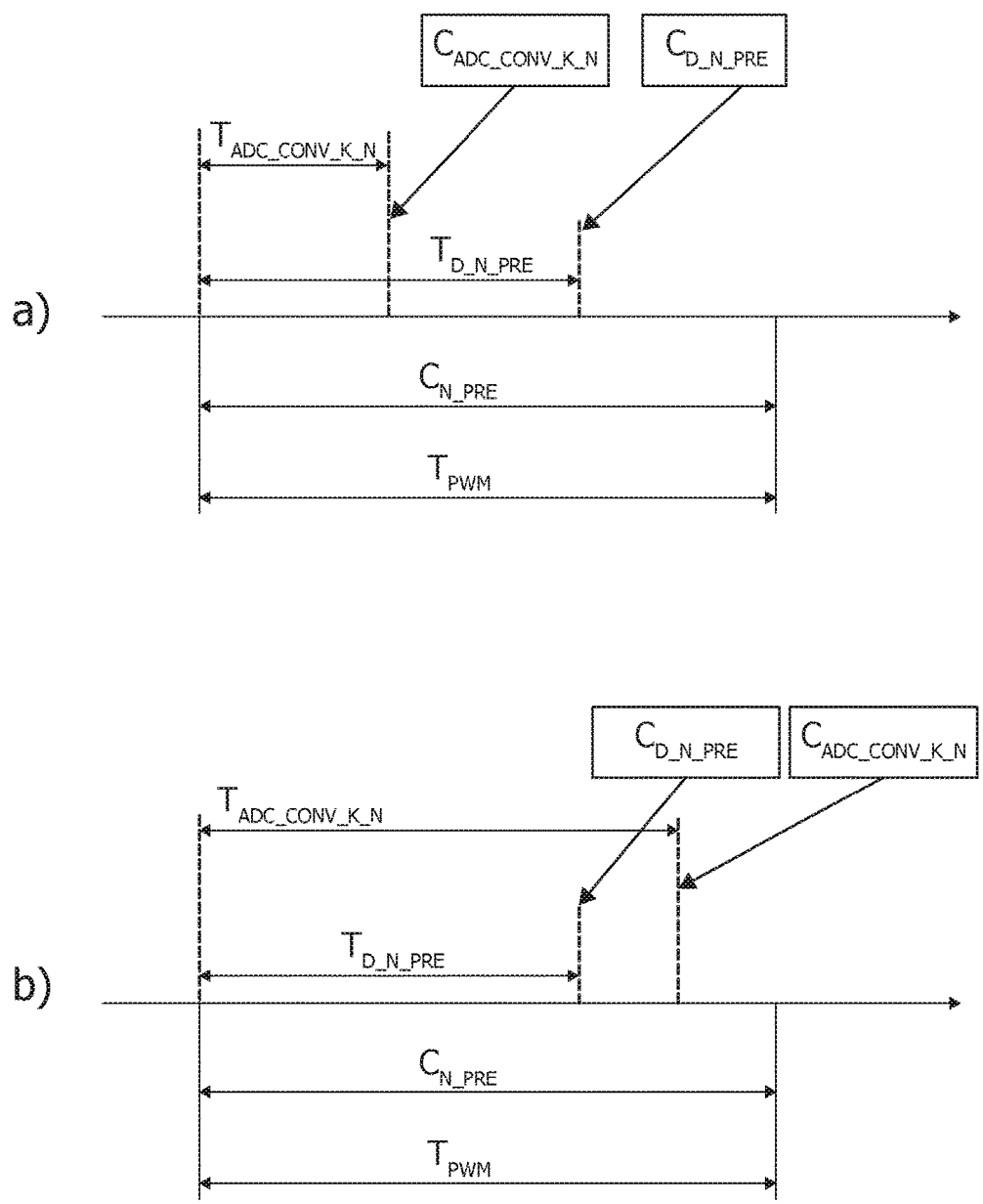

FIG. 6 is an exemplary graphical representation of possible relationships among these parameters.

In a step 116 ($C_{D\_N\_PRE} > 0$) a number of entities are defined/calculated, namely:

$f_{sys\_mod\_x\_N\_PRE} = f_{sys\_mod\_x+1\_N-1}$ $f_{sys\_mod\_x+1\_N\_PRE} = f_{sys\_mod\_x+2\_N-1}$ $C_{D\_N\_PRE} = T_{D\_N\_PRE} \cdot f_{sys\_mod\_x\_N\_PRE}$ $f_{sys\_mod\_N\_PRE} = (C_{D\_N\_PRE} + f_{sys\_mod\_x+1\_N\_PRE} \cdot (T_{PWM\_NOM} - T_{D\_N\_PRE}))/T_{PWM\_NOM}$ $C_{N\_PRE} = f_{sys\_mod\_N\_PRE} \cdot T_{PWM\_NOM}$ In a step 117 ($C_{D\_N\_PRE} > 0$) a check is made as to whether $T_{DUTY\_F\_W\_N} < T_{D\_N\_PRE}$ (where $T_{DUTY\_F\_W\_N} = DC_N \cdot T_{PWM\_NOM}$).

If the check yields a positive outcome, then the system evolves to a step 118. In the negative, the system evolves to a step 119.

In the step 118 $C_{DUTY\_F\_W\_N} = (T_{DUTY\_F\_W\_N} / T_{D\_N\_PRE}) \cdot C_{D\_N\_PRE}$ (which corresponds to the situation portrayed in FIG. 7a), with the same applying also to the ADC conversions (see FIG. 8a).

In the step 119 $C_{DUTY\_F\_W\_N} = C_{D\_N\_PRE} + (T_{DUTY\_F\_W\_N} - T_{D\_N\_PRE}) \cdot f_{sys\_mod\_x+1\_N\_PRE}$ (which corresponds to the situation portrayed in FIG. 7b), with the same applying also to the ADC conversions (see FIG. 8b).

The block 120 indicates an exit step after which the procedure just described may be repeated iteratively for a subsequent PWM period.

One or more embodiments as exemplified herein thus relate to a method of controlling an electric motor M by means of at least one pulse-width modulated control signal (e.g., PWM, ADC—see FIG. 1) having edge transitions occurring at one or more transition count values (e.g., $C_{DUTY\_F\_W\_N}$ and $C_{ADC\_CONV\_K\_N}$) of the pulses of the clock signal 20 which is frequency-modulated with a step-wise frequency modulation $f_{mod}$ (see, e.g., FIG. 2). In one or more embodiments the method may thus include:

providing a frequency unmodulated clock signal 10 having a fixed pulse period $T_{PWM\_NOM}$ indicative of the period of the pulse-width modulated control signals PWM, ADC; and setting the count values $C_{DUTY\_F\_W\_N}$ and $C_{ADC\_CONV\_K\_N}$ as a function of, e.g., predicted count value $C_{N\_PRE}$ and a predicted frequency value $f_{sys\_mod\_N\_PRE}$ for the frequency-modulated clock signal 20.

In one or more embodiments these predicted values may be predicted as a function of the frequency unmodulated clock signal 10, so that the transition count values (e.g., $C_{DUTY\_F\_W\_N}$ and $C_{ADC\_CONV\_K\_N}$) may be compensated against the step-wise frequency modulation of the clock signal 20.

As indicated, the previous flow chart refers to the (non binding) assumption that $T_S \geq T_{PWM\_NOM}$, that is that only one frequency modulation step may occur for each PWM period.

The procedure exemplified in the foregoing may be extended to the case where, e.g., $T_{PWM\_NOM} > T_S \geq T_{PWM\_NOM}/2$ that is where one or two modulation step changes may occur for each PWM period.

In that case, the flow chart of FIG. 4 may be modified as detailed in the following.

Steps 101 to 104 are unchanged.

In step 105, $f_{sys\_mod\_N-1}$ is compared with $f_{sys\_mod\_y'\_N-1}$ (with y=0, 1, ..., S-1) where $f_{sys\_mod\_y'\_N-1}$ is defined as $f_{sys\_mod\_y'\_N-1} = (f_{sys\_mod\_y\_N-1} + f_{sys\_mod\_y+1\_N-1})/2$ in order to identify the frequency $f_{sys\_mod\_x'\_N-1}$ of the triad ($f_{sys\_mod\_x'-1\_N-1}$, $f_{sys\_mod\_x'\_N-1}$, $f_{sys\_mod\_x'+1\_N-1}$) and the frequency $f_{sys\_mod\_x''\_N-1}$ of the triad ($f_{sys\_mod\_x''-1\_N-1}$, $f_{sys\_mod\_x''\_N-1}$, $f_{sys\_mod\_x''+1\_N-1}$).

In step 106, if $f_{sys\_mod\_x'\_N-1} = f_{sys\_mod\_x+1\_N-2}$ or $f_{sys\_mod\_x''\_N-1} = f_{sys\_mod\_x+1\_N-2}$ then the steps 106 to 109 (or 110) are performed as in the case of a single modulation step change during a PWM period.

Else, if $f_{sys\_mod\_x'-1\_N-1} = f_{sys\_mod\_x-1\_N-1}$ then ($f_{sys\_mod\_x-1\_N-1}$, $f_{sys\_mod\_x\_N-1}$, $f_{sys\_mod\_x+1\_N-1}$) = ($f_{sys\_mod\_x'-1\_N-1}$, $f_{sys\_mod\_x'\_N-1}$, $f_{sys\_mod\_x'+1\_N-1}$) else ($f_{sys\_mod\_x-1\_N-1}$, $f_{sys\_mod\_x\_N-1}$, $f_{sys\_mod\_x+1\_N-1}$) = ($f_{sys\_mod\_x'-1\_N-1}$, $f_{sys\_mod\_x'\_N-1}$, $f_{sys\_mod\_x'+1\_N-1}$).

In step 107, by considering $f_{sys\_mod\_N-1} = (f_{sys\_mod\_x-1\_N-1} * T_{D1\_N} + f_{sys\_mod\_x\_N-1} * (T_{D2\_N} - T_{D1\_N}) + f_{sys\_mod\_x+1\_N-1} * (T_{PWM} - T_{D2\_N})/T_{PWM}$ with $T_{D2\_N} = T_S + T_{D1\_N}$, $T_{D1\_N}$ and $T_{D2\_N}$ can be calculated and so $C_{D1\_N-1} = T_{D1\_N-1} * f_{sys\_mod\_x-1\_N-1}$ and $C_{D2\_N-1} = T_S * f_{sys\_mod\_x\_N-1}$.

In step 108, if $C_{D1\_N-1}$ is different from $C_{D1\_N-1\_PRE}$ or $C_{D2\_N-1}$ is different from $C_{D2\_N-1\_PRE}$ then the step 109 or the step 111 (modified as described in the following) may be performed.

In that respect it will be observed that $C_{D2\_N-1}$ is always greater than zero so step 110 may be skipped.

In step 111, if $2*T_{PWM\_NOM} \geq T_{D2\_N-1} + 2*T_S$ then the step 112 (modified as described in the following) may be performed.

Else the steps 112 to 120 are performed as in the case of one modulation step change for each PWM period.

In the step 112, $T_{D1\_N\_PRE} = T_S + T_{D2\_N-1} - T_{PWM}$ and $T_{D2\_N\_PRE} = T_S + T_{D1\_N\_PRE}$ and in the step 116 the following calculations are performed:

$f_{sys\_mod\_x-1\_N\_PRE} = f_{sys\_mod\_x+1\_N-1}$
$f_{sys\_mod\_x\_N\_PRE} = f_{sys\_mod\_x+2\_N-1}$
$f_{sys\_mod\_x+1\_N\_PRE} = f_{sys\_mod\_x+3\_N-1}$
$C_{D1\_N\_PRE} = T_{D1\_N\_PRE} * f_{sys\_mod\_x-1\_N\_PRE}$
$C_{D2\_N\_PRE} T_S * f_{sys\_mod\_x\_N\_PRE}$
$f_{sys\_mod\_N\_PRE} = (C_{D1\_N\_PRE} + C_{D2\_N\_PRE} + f_{sys\_mod\_x+1\_N\_PRE} * (T_{PWM} - T_{D2\_N\_PRE}))/T_{PWM\_NOM}$
$C_{N\_PRE} = f_{sys\_mod\_N\_PRE} * T_{PWM\_NOM}$ The steps 117 to 119 can be easily generalized considering that in this case three cases are possible, namely:

$T_{DUTY\_F\_W\_N} < T_{D1\_N\_PRE}$,
$T_{D1\_N\_PRE} < T_{DUTY\_F\_W\_N} < T_{D2\_N\_PRE}$ and
$T_{D2\_N\_PRE} < T_{DUTY\_F\_W\_N}$ the same also applying to the ADC conversions.

Those of skill in the art will otherwise appreciate that the procedure may be generalized by considering that if $T_{PWM}/2 > T_S \geq T_{PWM}/4$, three or two modulation step changes can occur for each PWM period and, in general, that if $T_{PWM}/k \geq T_S \geq T_{PWM}/k+1$, (k+2) or (k+1) modulation step changes can occur for each PWM period.

Here again, as throughout the embodiments exemplified herein, determining if one or more frequency modulation steps have occurred in the step-wise frequency modulation of the frequency-modulated clock signal 20 may involve measuring an average value for the frequency of the frequency-modulated clock signal 20 and comparing the average value measured with a set of values for the frequency of the frequency-modulated clock signal 20 in order to identify, as a function of the modulation profile of the step-wise frequency modulation, a pair of values for the frequency of the frequency-modulated clock signal leading to the average value measured.

Also, throughout the embodiments exemplified herein, measuring an average value for the frequency of the frequency-modulated clock signal 20 may includes calculating a number of clock cycles of the frequency-modulated clock signal 20 occurring over at least a portion of the fixed period $T_{PWM\_NOM}$ of the unmodulated clock signal 10, or retrieving the average value as a function of the difference between the numbers of clock cycles of the frequency-modulated clock signal 20 occurring over subsequent periods $T_{PWM\_NOM}$ or over subsequent portions of the unmodulated clock signal 10.

Whatever the specific procedure adopted, all the related processing may be conveniently performed, e.g., at a firmware level in the PWM submodule 12.

In one or more embodiments, the PWM internal counter in the module 12 may be reset on each PWM pulse occurrence, by using the number of (modulated) clock cycles counted in processing as described.

In one or more embodiments, the PWM internal counter in the module 12 may not be reset on each PWM pulse occurrence, by using in processing as described the difference between the cumulative values stored at the end of the current PWM period N and the previous PWM period N-1.

In one or more embodiments, as an alternative to calculation as described in the foregoing, a value for $f_{sys\_mod\_N}$ may be retrieved in a look-up table (LUT), e.g., in the module 12 by using the difference between the current measured value for $C_N$ and a nominal value therefor as an entry to the table.

In one or more embodiments, in the place of divisions, multiplications may be used as these latter may be faster to implement. For instance, multiplication by a frequency may be used in the place of division by a corresponding period.

Without prejudice to the underlying principles, the details and embodiments may vary, even significantly, with respect to what has been described by way of example only, without departing from the extent of protection.

The extent of protection is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of controlling an electric motor, comprising:

providing, by a first clock generator, a frequency unmodulated clock signal having a fixed period indicative of the period of at least one pulse-width modulated control signal, the at least one pulse-width modulated control signal having edge transitions occurring for at least one transition count value of pulses of a frequency-modulated clock signal, provided by second clock generator, that is frequency-modulated with a step-wise frequency modulation;

setting said at least one transition count value as a function of at least one of a predicted count value and a predicted frequency value for said frequency-modulated clock signal predicted as a function of said frequency unmodulated clock signal, said at least one transition count value being compensated against said step-wise frequency modulation;

detecting if a frequency modulation step in said step-wise frequency modulation has occurred over a certain time; and if no frequency modulation step in said step-wise frequency modulation has occurred over said certain time, applying a time or count residue to a subsequent detection time by subtracting said residue from said subsequent detection time.

2. The method of claim 1, wherein predicting said predicted frequency value for said frequency-modulated clock signal includes measuring an average value for the frequency of said frequency-modulated clock signal and comparing said average value measured with a set of values for the frequency of said frequency-modulated clock signal in order to identify a pair of values for the frequency of said frequency-modulated clock signal leading to said average value measured, thus determining if at least one frequency modulation step has occurred in said step-wise frequency modulation of said frequency-modulated clock signal.

3. The method of claim 2, wherein said step-wise frequency modulation has a triangular modulation profile including upward and downward modulation steps, the method including identifying said pair of values for the frequency of said frequency-modulated clock signal out of plural pairs as a function of the modulation profile of said step-wise frequency modulation.

4. The method of claim 3, including identifying a current pair of values for the frequency of said frequency-modulated clock signal as a function of a homologous previous pair of values for the frequency of said frequency-modulated clock signal.

5. The method of claim 2, wherein generating said average value for the frequency of said frequency-modulated clock signal comprises generating said average value as a function of:

i) a number of clock cycles of said frequency-modulated clock signal occurring over at least a portion of the fixed period of said unmodulated clock signal, or ii) difference between the numbers of clock cycles of said frequency-modulated clock signal occurring over subsequent periods or over subsequent portions of said unmodulated clock signal.

6. The method of claim 1, wherein:

said frequency-modulated clock signal is a high-frequency clock signal to which spread spectrum clock generation is applied, preferably with a triangular step-wise frequency modulation, and said frequency unmodulated clock signal is a low frequency clock signal, with said fixed period equal to the period of said at least one pulse-width modulated control signal.

7. The method of claim 6, wherein said frequency-modulated clock signal has a frequency in the megahertz frequency range and said frequency unmodulated clock signal has a frequency in the kilohertz frequency range.

8. The control system of claim 7, wherein the pulse width modulation module, as part of generating the predicted frequency value for the frequency modulated clock signal, is configured to:

detect an average value for the frequency of the frequency-modulated clock signal;

comparing the detected average value with a set of values for the frequency of said frequency-modulated clock signal to identify a pair of values for the frequency of the frequency-modulated clock signal that leads to the detected average value; and determine if at least one frequency modulation step has occurred in the step-wise frequency modulation of the frequency-modulated clock signal.

9. The control system of claim 8, wherein the frequency modulated clock generator modulates the clock signal with step-wise frequency module having a triangular modulation profile including upward and downward modulation steps.

10. The control system of claim 9, wherein the pulse width modulation module is further configured to identify said pair of values for the frequency of said frequency-modulated clock signal out of plural pairs as a function of the modulation profile of said step-wise frequency modulation.

11. The control system of claim 10, wherein the pulse width modulation module is further configured to identify a current pair of values for the frequency of the frequency-modulated clock signal as a function of a homologous previous pair of values for the frequency of the frequency-modulated clock signal.

12. A control system for controlling an electric motor, including:

a frequency modulated clock generator configured to generate a clock signal which is frequency-modulated with a step-wise frequency modulation;

a pulse width modulation module configured to generate at least one pulse-width modulated control signal for said motor, said at least one pulse-width modulated control signal having edge transitions occurring for at least one transition count value of the pulses of a clock signal which is frequency-modulated with a step-wise frequency modulation;

a frequency unmodulated clock generator configured to generate a frequency unmodulated clock signal having a fixed period indicative of the period of said at least one pulse-width modulated control signal;

wherein said pulse width modulation module is configured to set said at least one transition count value as a function of at least one of a predicted count value and a predicted frequency value for said frequency-modulated clock signal predicted as a function of said frequency unmodulated clock signal, wherein said at least one transition count value is compensated based on said step-wise frequency modulation; and wherein predicting said predicted frequency value for said frequency-modulated clock signal includes:
generating an average value fort e frequency of said frequency-modulated clock signal as a function of:
a number of clock cycles of said frequency-modulated clock signal occurring over at least a portion of the fixed period of said unmodulated clock signal; or
a difference between the numbers of clock cycles of said frequency-modulated clock signal occurring over subsequent periods or over subsequent portions of said unmodulated clock signal; and
comparing said average value measured with a set of values for the frequency of said frequency-modulated clock signal in order to identify a pair of values for the frequency of said frequency-modulated clock signal leading to said average value measured, thus determining if at least one frequency modulation step has occurred in said step-wise frequency modulation of said frequency-modulated clock signal.

13. The control system of claim 12 further comprising an electric motor coupled to the frequency modulated clock generator.

14. A computer program product loadable into a memory of at least one processor module and including software code portions for executing a method when the product is run on the at least one processor module, the method comprising:
frequency modulating a clock signal generated by a first clock generator with a step-wise triangular modulation profile including upward and downward steps to generate a frequency modulated clock signal, the frequency modulating including identifying a current pair of values for the frequency of the frequency modulated clock signal as a function of a homologous previous pairs of values for the frequency of the frequency-modulated clock signal;
generating a frequency unmodulated clock signal by a second clock generator, the frequency unmodulated clock signal having a fixed period indicative of a period of at least one pulse-width modulated control signal, wherein the at least one pulse-width modulated control signal has edge transitions occurring for at least one transition count value of pulses of the frequency modulated clock signal;
generating a predicted count value and a predicted frequency of the frequency modulated clock signal based upon the frequency of the unmodulated clock signal, wherein generating the predicted frequency of the frequency modulated clock signal includes:
measuring an average value for the frequency of the frequency-modulated clock signal; and
comparing the average value measured with a set of values for the frequency of said frequency modulated clock signal in order to identify a pair of values for the frequency of the frequency-modulated clock signal leading to the average value measured to thereby determine if at least one frequency modulation step has occurred in the step-wise frequency modulation of the frequency-modulated clock signal;
setting the at least one transition count value based on at least one of the predicted count value and the predicted frequency for the frequency modulated clock signal; and
compensating the at least one transition count value using the step-wise frequency modulation profile.

15. The computer program product of claim 14, wherein identifying a pair of values for the frequency of the frequency modulated clock signal from among a plurality of pairs of the step-wise triangular modulation profile comprises identifying a current pair of values for the frequency of the frequency modulated clock signal based upon previous pairs of values for the frequency of the frequency modulated clock signal.

16. The computer program product of claim 15, wherein the method further comprises generating pulse width modulation signals responsive to the generated frequency unmodulated clock signal.

* * * * *

UNITED STATES PATENT AND TRADEMARK OFFICE
CERTIFICATE OF CORRECTION

| | | |
|---|---|---|
| PATENT NO. | : 10,468,948 B2 | Page 1 of 1 |
| APPLICATION NO. | : 15/066802 | |
| DATED | : November 5, 2019 | |
| INVENTOR(S) | : Giuseppe D'angelo et al. | |

It is certified that error appears in the above-identified patent and that said Letters Patent is hereby corrected as shown below:

In the Claims

Column 13, Line 3:
"generating an average value fort e frequency of said"
Should read:
--generating an average value for the frequency of said--.

Signed and Sealed this
Seventh Day of April, 2020

Andrei Iancu
*Director of the United States Patent and Trademark Office*